United States Patent [19]
Degani et al.

[11] Patent Number: 5,346,118
[45] Date of Patent: Sep. 13, 1994

[54] SURFACE MOUNT SOLDER ASSEMBLY OF LEADLESS INTEGRATED CIRCUIT PACKAGES TO SUBSTRATES

[75] Inventors: Yinon Degani, Highland Park; Thomas D. Dudderar, Chatham, both of N.J.; William L. Woods, Jr., Keithville, La.

[73] Assignee: AT&T Bell Laboratories, Murray Hill, N.J.

[21] Appl. No.: 128,492

[22] Filed: Sep. 28, 1993

[51] Int. Cl.$^5$ ............................................. H05K 3/34
[52] U.S. Cl. ........................... 228/180.22; 228/248.1; 228/254; 427/191; 427/383.7
[58] Field of Search ................ 228/180.22, 254, 248.1, 228/39; 427/123, 143, 191, 383.7; 118/406

[56] References Cited

U.S. PATENT DOCUMENTS

| | | | |
|---|---|---|---|
| 3,486,223 | 12/1969 | Butera | 29/626 |
| 4,376,505 | 3/1983 | Wojcik | 228/180.22 |
| 4,872,261 | 10/1989 | Sanyal et al. | 228/180.21 |
| 4,878,611 | 11/1989 | Lo Vasco et al. | 228/180.22 |
| 5,046,415 | 9/1991 | Oates | 101/128.21 |
| 5,211,764 | 5/1993 | Degani | 148/25 |
| 5,261,593 | 11/1993 | Casson et al. | 228/180.22 |

OTHER PUBLICATIONS

IEEE Transactions on Components, Hybrids, and Manufacturing Technology, "Thermal Deformations Observed in Leadless Ceramic Chip Carriers Surface Mounted to Printed Wiring Boards," by Peter M. Hall, T. Dixon Dudderar and John F. Argyle, vol. CHMT-6, No. 4, Dec. 1983, pp. 544–552.
Microelectronics Package Handbook, Section 5-5, "Thermal Mismatch and Thermal Fatigue," by Van Nostrand Reinhold, 1989 edition, pp. 277–320.
Solder Paste Technology, by Colin C. Johnson and Joseph Kevra, Ph.D., TAB Books Inc., 1989, pp. 41–43.
BGAs Face Production Testing, by Dave Hattas, Advanced Packaging, Summer 1993, pp. 44–46.

*Primary Examiner*—Samuel M. Heinrich
*Attorney, Agent, or Firm*—Oleg E. Alber

[57] ABSTRACT

Described are a process for soldering at least one component having solder bumps to a substrate and a process for forming solder bumps on metal pads of an element, such as an IC package or substrate or both. The bumps are formed by stencil printing solder paste deposits on the metal pads, heating the solder paste deposits to reflow temperature of the solder in the solder paste deposits, and allowing the molten solder in each deposit to coalesce and during subsequent cooling solidify forming the bumps on the metal pads. The bumps are formed by conducting the stencil printing through apertures in an ultra-thick stencil, the apertures having trapezoidal crossection in the plane normal to the broad surfaces of the stencil with the top opening being smaller than the bottom opening and with the walls of the aperture sloping at an angle within a range of from 1 to 45 degrees from the vertical, the solder paste having a low tackiness and high metal loading, and the solder paste deposits covering an area which is equal to or exceeds an area of the metal pad in any ratio between 1.5:1 and 5:1. Bumps formed in this manner lead to the formation of reliable solder joints.

20 Claims, 4 Drawing Sheets

5,346,118

SURFACE MOUNT SOLDER ASSEMBLY OF LEADLESS INTEGRATED CIRCUIT PACKAGES TO SUBSTRATES

TECHNICAL FIELD

This invention concerns surface mount solder assembly of leadless integrated circuit packages to substrates.

BACKGROUND OF THE INVENTION

In the evolution of electronic packaging many electronically operated devices include mounting boards having one or more of solder bumped packages, such as integrated circuit (IC) packages, surface mounted thereon. Each IC package may include one or more IC units, such as an IC chip or an IC module. While many interconnections are accomplished within the package, connections to the outside of the package, such as power, ground, signaling, etc., require numerous external I/Os between the package and the board. This is conveniently accomplished by means of leadless solder joints on the IC package. The term leadless solder joint means that there are no flexible conduction leads or rigid pins for establishing an electrically conductive path between contact pads on the flip side of the package and terminal pads on the board.

The first objective of any leadless attachment technology, regardless of whether it is a perimeter or an area array, is to achieve the greatest possible interconnection height so as to minimize the effects of thermally driven fatigue (which might otherwise be accommodated by lead compliance in a leaded package). This need for solder joint height is generally interpreted as striving for the greatest possible solder bump/joint volume for a given pad area, pitch, etc. For this reason, relatively large solder preforms are used conventionally to assure solder volume. The large volume solder bumps are needed to maximize the IC package-to-board stand off (joint height as a direct means of minimizing the development of thermally induced shear strain in the resulting solder joints). See P.M. Hall et al., "Thermal Deformations Observed in Leadless Ceramic Chip Carriers Surface Mounted to Printed Wiring Boards", IEEE Transactions on Components, Hybrids and Manufacturing Technology, Vol. CHMT-6, No. 4, December 1983, pages 544–552. The thermal mismatch strains increase as the size and/or number of the IC packages increases. To understand the influence of component size on thermal strain magnitude and of the latter on the fatigue life of leadless interconnections see Microelectronics Package Handbook, Section 5—5, Thermal Mismatch and Thermal Fatigue, Van Nostrand Reinhold, 1989 edition, pages 277–320.

U.S. Pat. No. 4,878,611 issued on Nov. 7, 1989 to Francis LoVasco et al., describes a process for controlling solder joint geometry when surface mounting leadless IC packages on a substrate. The solder joint assembly technique is used to apply controlled volumes of solder to pads of both the package and the substrate. The solder volume deposits may assume various forms including truncated spherical bumps, solder preforms and solder paste deposits. The two units are positioned adjacent each other with the bumps and solder preforms or paste deposits mechanically maintained in registration with each other. The assembly is reflowed and the final separation between package and substrate at which the resultant solder joint solidifies is mechanically controlled in order to control the geometry of the resultant solidified joint.

However, mechanically controlled separation is not always practical or advantageous. Therefore, one of the problems arising in the solder assembly of the IC packages on the board, namely, the provision of a sufficient amount of solder needed to establish a reliable solder joint while at the same time avoiding shorts between adjacent solder joints, still remains.

SUMMARY OF THE INVENTION

This invention embodies a process for soldering at least one component having solder bumps to a substrate and a process for forming solder bumps on metal pads of an element, such as an IC package or substrate or both. The bumps are formed by stencil printing solder paste deposits on the metal pads, heating the solder paste deposits to reflow temperature of the solder in the solder paste deposits, and allowing the molten solder in each deposit to consolidate into a single mass and during subsequent cooling solidify forming the bumps on the metal pads. The bumps are formed by conducting the stencil printing through apertures in an ultra-thick stencil, the apertures having trapezoidal crossection in the plane normal to the broad surfaces of the stencil with the top opening being smaller than the bottom opening and with the walls of the apertures sloping at an angle within a range of form 1 to 45 degrees from the vertical, the solder paste having a low tackiness and high metal loading, and the solder paste deposits covering an area which is equal to or exceeds an area of the metal pad in a ratio ranging from 1.5:1 to 5:1. Bumps formed in this manner lead to the formation of reliable solder joints.

BRIEF DESCRIPTION OF THE DRAWINGS(s)

DETAILED DESCRIPTION

Figure 1:
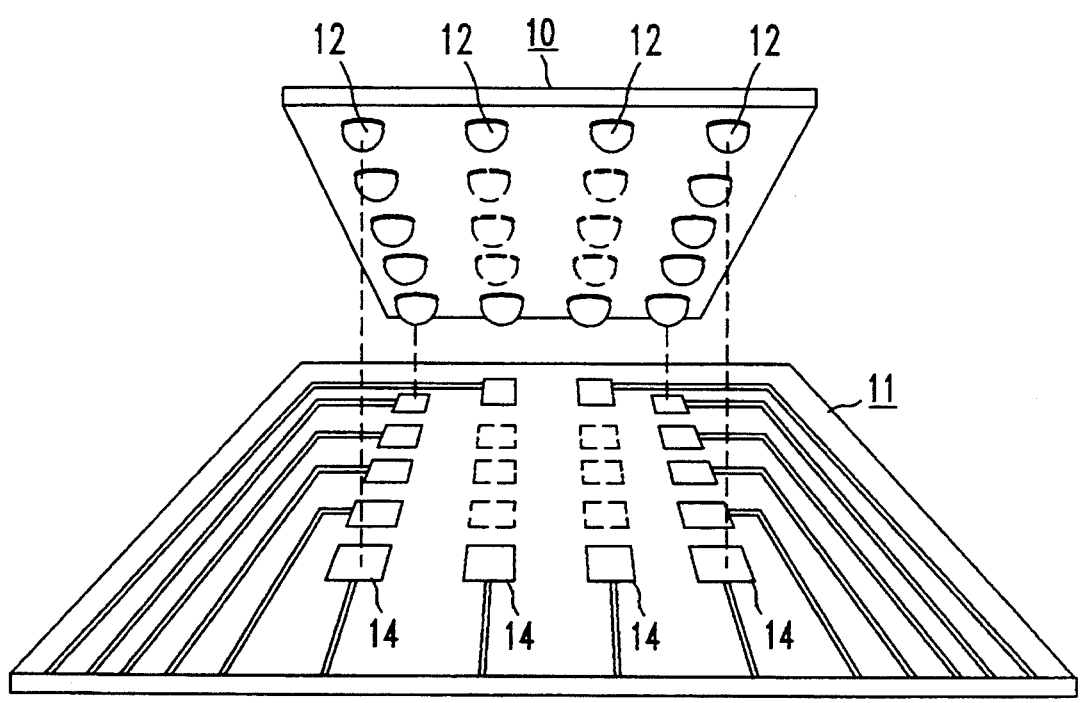
FIG. 1 is an exploded view of a solder bumped IC package positioned over terminal pads on a substrate prior to the solder assembly operation.
Figure 2:
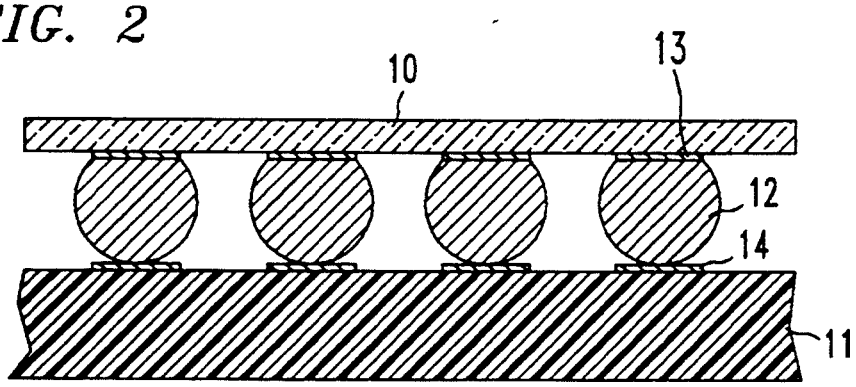
FIG. 2 is a crossectional view of a solder bumped IC package positioned on a substrate, shown prior to reflow soldering.

FIG. 1 is a view of an IC package, 10, shown spaced above a substrate, such as a printed board, 11, upon which the IC package is to be mounted. The bottom or flipside of the IC package includes a plurality of solder bumps, 12, positioned on contact pads, 13 (FIG. 2). Solder bumps 12 and contact pads 13 are disposed in positions directly opposite terminal pads, 14, provided on board 11. In this illustration, the contact pads, and thus the bumps, are arranged on the periphery of the IC package. However, the contact pads may also be arranged in the form of a grid array of contacts on the package and on the board as suggested in phantom lines in FIG. 1. Also, in practice some of the contact pads may not be provided with solder bumps, thus avoiding an electrically conductive connection between such contact pads and corresponding terminal pads on the board.

Figure 3:
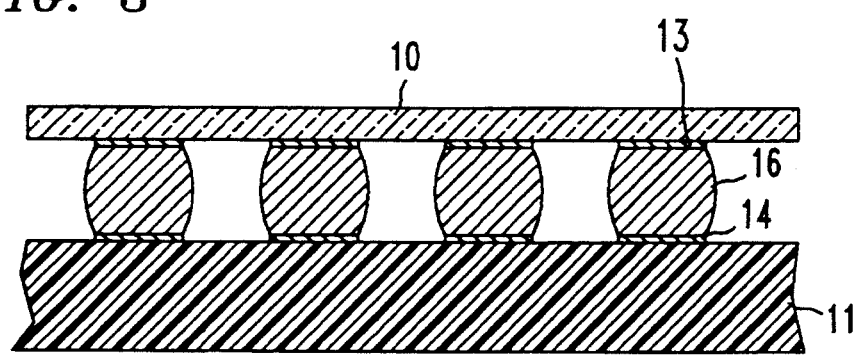
FIG. 3 is a crossectional view of the package and substrate joined together by reflow solder joints.

FIG. 2 is a crossection view of an IC package 10 positioned atop board 11 so that solder bumps 12 on the IC package engage abuttingly corresponding terminal pads 14 on the board. A typical solder bump 12 has a shape resembling a truncated sphere. The bumps are formed by depositing a controlled volume of solder paste onto contact pads 13, heating to melt the solder material in the paste deposit, and permitting the solder to solidify during subsequent cooling. In the process, the solder assumes the shape of the truncated sphere. Prior to placing IC package 10 atop board 11, the board or at least terminal pads 14, are provided with a thin layer of flux. Preferably, this flux has a tacky or sticky characteristic which is useful in retaining alignment between the package and the board. In the process of assembling, the IC package and the board are aligned each with another. Lateral alignment of bumps 13 and of the terminal pads 14 is accomplished during the preassembly of the IC package and the board. Upon being heated sufficiently to melt the solder, the package floats upon the molten solder which, when subsequently permitted to solidify, forms a solid joint, 16, shown in FIG. 3.

Figure 4:
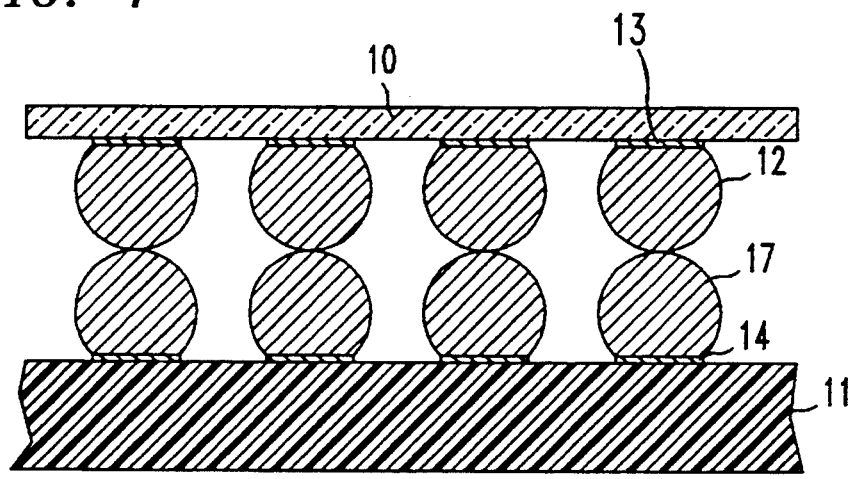
FIG. 4 is a crossectional view of a solder bumped IC package positioned on a solder bumped substrate, shown prior to reflow soldering.
Figure 5:
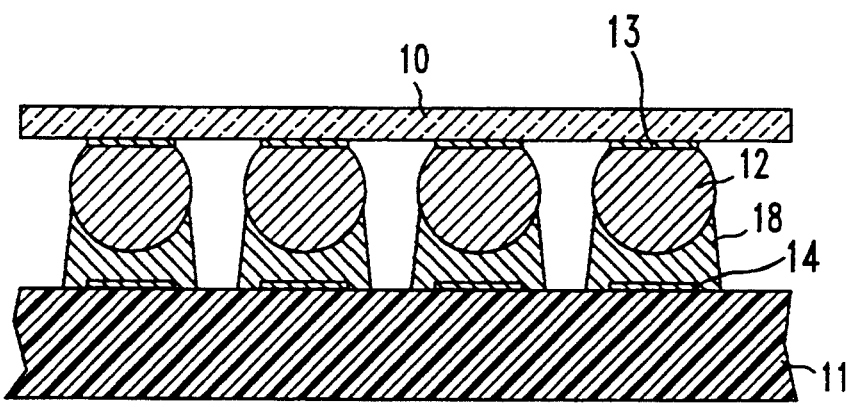
FIG. 5 is a crossectional view of a solder bumped IC package positioned on a substrate with solder paste deposits, shown prior to reflow soldering.

In FIG. 4 is shown an assembly with solder bumps 12 and 17 formed on both the IC package and on the board, respectively. In FIG. 5 is shown an assembly with solder bumps formed on the IC package and solder paste deposits, 18, formed over terminal pads on the board. Upon heating, the bumps on the package and on the board or the bumps on the package and solder paste deposits on the board, respectively, are caused to melt and re, solidify forming solder joints similar to joints 16 shown in FIG. 3. Of course, these joints will be higher than joints 16.

The process of forming the solder bumps involves stencil-printing solder paste deposits on pads of the IC package or the board or both, and reflowing to form the solder bumps. The paste includes a solder alloy powder and a flux vehicle mixed together, a process based on standard surface mount technology (SMT). A conventional view of such a printed paste based process would be that it could not provide the solder bump volumes required to assure the interconnection joint heights needed to minimize the effects of thermally driven fatigue in the assembled package in subsequent use.

In general, all solder pastes are combinations of a flux and a solder alloy powder. The combination of the flux and solder powder controls the printing, slump, tackiness and activity of the solder paste as described in Solder Paste Technology by C. C. Johnson and J. Kevra TAB Books Inc. 1989 pp. 41–43. A flux suitable for a solder paste applications must be a vehicle that can both hold a large volume of the solder alloy powder (normal metal loadings are on the order of 50% to 60% powder, by volume, the rest being flux) and provide for stencil printability. It must also remove metal oxides from both the powder and the wettable metal surfaces of the pads to be soldered during the reflow process so as to assure solder wetting and minimize the formation of stray, detached balls of solder during the reflow process (so-called reflow solder balls).

Conventional SMT solder pastes provide high stickyness in order to hold components to the circuit board throughout the SMT assembly process and until reflow is completed. Unfortunately, this adhesive property limits the use of very thick stencils because it promotes an uncontrollable retention of the paste in the necessarily deeper stencil apertures intended to provide a greater volume of solder paste needed to establish reliable solder joints. Consequently, the volume of conventional SMT paste that can be deposited through a stencil aperture of any given area is severely restricted, and cannot be easily increased by simply using a thicker stencil.

The present process, however, achieves exceptional joint volumes and reliable interconnection heights by means of a unique combination of a specially optimized solder paste, ultra-thick stencils having apertures with trapezoidal crossection configuration (see FIG. 6), and by grossly overprinting the pad areas. This process can readily be carried out on conventional SMT equipment.

The specially optimized solder paste is required to provide reproducible printing through very thick stencils, slump very little when heated to reflow, and assure that each solder paste deposit consolidates into a single solder ball upon reflow leaving no more than one percent by volume of solder balls behind. Also the residue that is left after reflow should preferably have high surface insulation resistance and allow probe testing so that the process can be completed and the solder bumped package can be tested without cleaning. The solder paste, specially optimized for use with extra-thick stencils and hereinafter referred to as a YD solder paste, includes a YD flux and a solder alloy powder or powders, whose composition and processing are described herein below. The YD flux (and, consequently, the YD paste) is formulated to have a low stickyness so as to be readily printable through the very thick stencils needed to deposit large paste volumes. The YD flux is a low-residue formulation which is qualified for use without the need for subsequent cleaning, if reflowed in an inert atmosphere. This avoids the need for a post-bumping cleaning of the IC package which must experience refluxing anyway when it is eventually soldered to the board.

As described in US Pat. No. 5,211,764 issued on May 18, 1993 to Yinon Degani which is incorporated herein by reference, a flux vehicle for solder paste includes the following basic constituents: a solvent, an oxide removing component and a rheological additive to improve printability. A flux vehicle suitable for the stencil printing according to the invention comprises 1 to 10 weight percent (wt. %) of an organic acid, 1 to 5 wt. % of a rheological additive comprising a polymer having a molecular weight greater than 50,000, 60 to 98 wt. % of solvent system, and 0 to 25 wt. % of a further additives whose residue maintains high surface insulation. To provide for the low tackiness that helps with the printing through a thick stencil, the prior flux described in U.S. Pat. No. 5,211,764 is used with concentration of the rheological additive toward the lower end of the range, e.g., by using from 1 to 3 weight percent of the theological additive instead of 4 to 5 weight percent. This generates a low stickyness paste and allows high metal loading which results in low slump.

An example of YD flux composition is as follows:

| Chemical | Weight % Range | Weight % Preferred |
| --- | --- | --- |
| Sebacic acid | 1–3 | 2.5 |
| propyl 4-hydroxybenzoate | 20–30 | 25 |
| ethyl cellulose | 1–3 | 1.5 |
| dimerized rosin | 1–5 | 3 |
| penta erythritol tetrabenzoate | 1–5 | 3 |
| castor oil | 1–5 | 3 |
| tripropylene glycol | remainder | remainder |

Another example of a YD flux composition is as follows:

| Chemical | Weight % Range | Weight % Preferred |
| --- | --- | --- |
| 4-hydroxybenzoic acid | 1–8 | 6.0 |
| propyl 4-hydroxybenzoate | 20–30 | 25.0 |
| ethyl cellulose | 1–3 | 1.5 |
| hydrogenized rosin gum | 0–25 | 14.0 |
| tripropylene glycol | remainder | remainder |

A stencil, 19, (FIG. 6) for use in the inventive bumping process is a few times as thick as conventional SMT stencils. While conventional stencils may run from 3 to 10 mils in thickness, the stencils for this process may run up to 30 mils in thickness. For the specific embodiment, described in Example 3 below, the stencil is 21 mils thick. This is roughly three times the thickness of a conventional SMT stencil. Furthermore, the stencil has apertures, 20, trapezoidal in crossection in a plane normal to broad surfaces of the stencil wherein the top or paste entry opening is somewhat smaller than the bottom opening. The walls of the apertures are in the form of a truncated cone, a truncated pyramid or some other configuration with walls sloping within a range of from 1 to 45, preferably 5–10 degrees from the vertical. This aperture configuration, in combination with the low stickiness of the YD solder flux in the paste, greatly facilitates release of the special paste from the stencil after printing.

Figure 6:
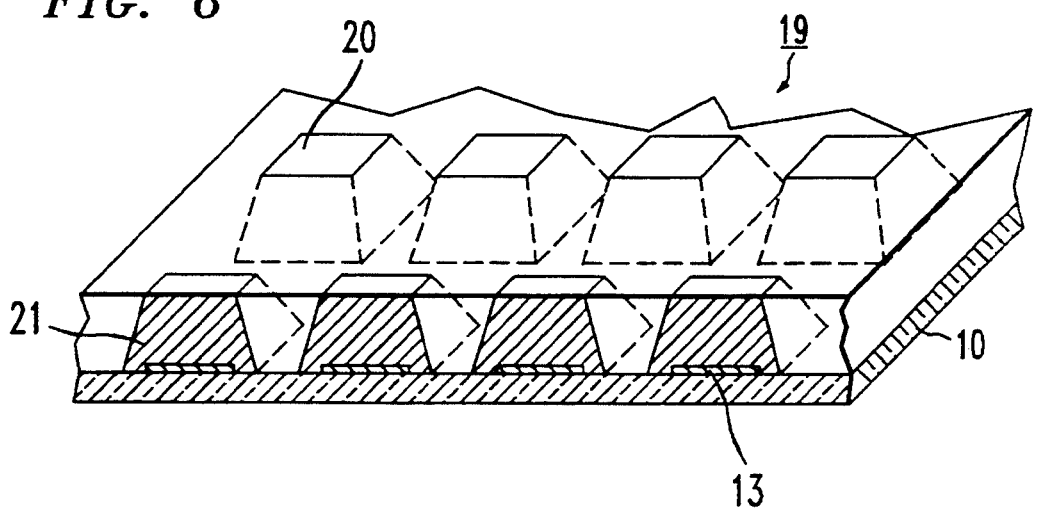
FIG. 6 is crossectional view of an IC package or a substrate with a stencil plate and solder paste deposits positioned over pads on the IC package or a substrate.

The stencil is designed with apertures in which a ratio of a diameter, "D" (or one side of a square) at the bottom of the aperture to the height "h" (or the thickness of the stencil) is $>1.5:1$, preferably $\geq 2.5:1$. Also the ratio of the diameter D to the distance "p" between the centers of two adjoining pads being approximately D:p=2:3, with a limit of D:p$\leq$3:4. The stencil with paste deposits, 21, within apertures 20 of the stencil is shown in FIG. 6 of the drawings.

In order to achieve large solder bump volumes, the process requires overprinting the pads with solder paste in a ratio of 1.5–5, preferably 3–4. This means that the cross sectional areas of the base openings in the stencil are made so large that each solder paste deposit covers from 1.5 to 5 times the area of contact pad 13 (or terminal pad 14) over which they are printed. During reflow with such extreme overprinting, many conventional SMT solder pastes would generally leave significant residues of unconsolidated solder in the form of numerous unwanted, isolated balls which would have to be removed lest they become a reliability problem by causing electrical shorts, etc, should they eventually come loose on their own and start to move about. This would necessitate a cleaning step prior to assembly. More of a problem, however, would be the variability of consolidation during solder reflow which can result in shorts and uncontrolled deviations in the volumes, and hence the heights, of the solder bumps themselves. For example, when two solder paste deposits cluster together and during reflow form a single large deposit bridging two pads or when a portion of one deposit joins partially an adjacent deposit resulting after reflow in two bumps of a differing size or even when one pad is without solder and a second pad with a double volume of solder on it. However, such variability does not occur with the specially optimized YD solder paste. All but an insignificant trace of each overprinted solder paste deposit is consolidated into a single, large volume bump wholly affixed to the contact pad. This assures consistent bump to bump uniformity and reliable performance without cleaning.

Finally, one should consider the choice of an appropriate solder alloy. The composition of the solder alloy is, in general, not critical to the bumping process and includes, for example common solder alloys such as Sn/Pb (63/37, 60/40 and 5/95 wt. %), Sn/Ag (96.5/3.5 wt. %), Sn/Sb (95/5 wt. %), Sn/Zn (94/6 wt. %), Sn/Bi (42/48 wt. %) and Sn/Pb/Bi (43/43/14 wt. %). Often, the placement and wave solder assembly of other components to the board is accomplished prior to affixing the bumped IC packages; therefore it may be necessary to carry out the process of attaching the bumped IC packages to the board with the board being upside down. Consequently, use of a solder alloy that reflows at a temperature at or above the melting point of a solder alloy conventionally used to wave solder the through-hole components in place might cause such components to come loose and fall from the board. An example of such a conventional alloy is a Sn/Pb eutectic or near eutectic alloy with a melting point at or above 183 degrees. Consequently, a solder alloy with a lower melting point must be used in the bumping paste. A Sn/Pb/Bi (43/43/14) powder, known to be unaffected by small variations in Pb content, and with a melting point below 183 degrees C. would be most suitable for the YD solder paste. This alloy, commercially available in powder form, has respectable fatigue characteristics, especially when compared to the Sn/Bi alloy (although it cannot match those of most commonly used Sn/Pb alloys).

The following examples are illustrative of the inventive flux and solder paste composition and the inventive process.

EXAMPLE 1

To prepare 1.5 kg of the YD flux approximately 90 gram (g) 4-hydroxybenzoic acid, 210 g hydrogenareal rosins, 22.5 g ethyl cellulose, and 375 g propyl 4-hydroxybenzoate are mixed with 802 g tripropylene glycol in a 2 liter glass beaker on a hot plate equipped with a magnetic stirrer. The temperature of the mixture is allowed to rise to 120–130 degrees C and remain at that temperature for 25 minutes with continuous stirring. The flux is then cooled to room temperature.

EXAMPLE 2

To prepare 5.0 kg of paste with flux of Example 1 and with Sn/Pb/Bi 43/43/14 solder, combine 375 g of the flux with 4625g Sn/Pb/Bi 43/43/14 solder powder, −325+500 mesh, by placing the flux in a stainless steel mixing bowl of a KitchenAid mixer, and then, while mixing at about 40 RPM, slowly adding the solder powder. The flux and the powder are mixed for about 1 minute to obtain an homogeneous paste. After scraping any leftover of flux or powder into the bulk of the paste, the paste is mixed again for additional 30 seconds. The resulting paste is divided into convenient small quantities, e.g., 125 ml, and stored in plastic jars.

EXAMPLE 3

Figure 7:
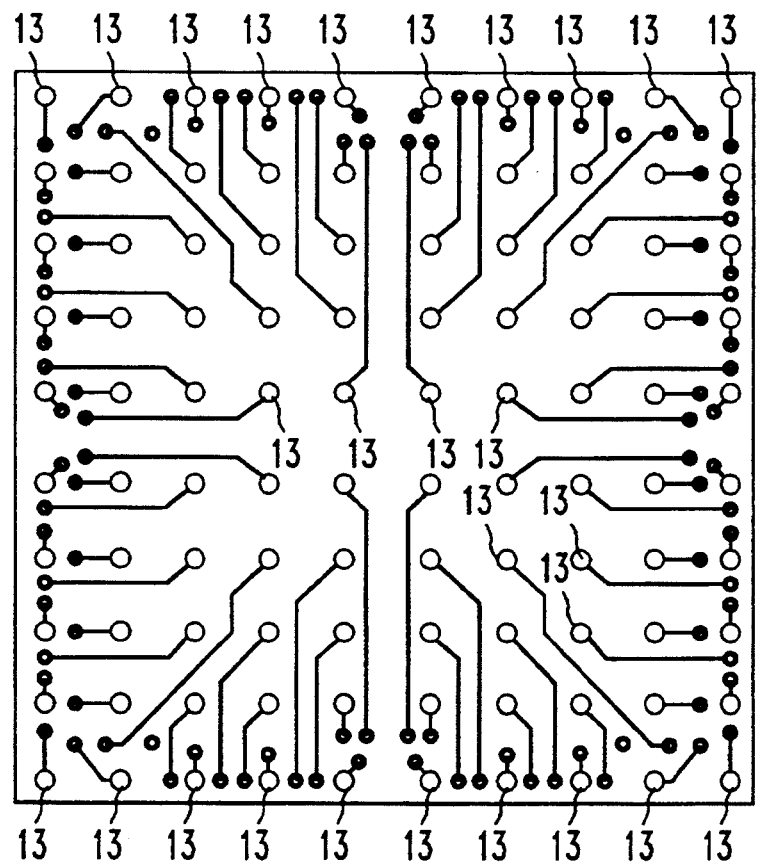
FIG. 7 is a view of a flipside of an IC package with a 10×10 grid array of contact pads.

The YD solder paste of Example 2 is then used to fabricate solder bumps on a 10 unit array of IC circuits on a wafer. A flipside of one such unit is shown in FIG. 7, disclosing a 10×10 grid array of contact pads 13 and an associated conductor scheme. Contact pads are exposed while conductors are insulated so that no electrical contact is formed by solder contacting the conductors.

The pads in the array are 32–35 mils in diameter and are arranged on a 100 mil pitch, which means that the center of any pad is at a distance of 100 mils from the center of any other adjacent pad. The paste of Example 2 was printed through a stencil 21 mils thick and having apertures with 60 mil diameter top opening and 64 mil diameter bottom opening, the latter being adjacent to the contact pad on the device. Upon reflow, the solder paste deposits provided bump height nearly as great as the contact pad diameters.

The above-described stencil printed solder paste bumping technology was developed as a SMT compatible batch process for the high throughput, relatively large volume application. As designed, it consistently provides bump heights nearly as great as the pad diameters, a performance that here-to-for always necessitated the use of preforms and the associated problems of placement, fluxing, stabilization, etc. The inventive bumping technology can also be applied to fine pitch designs for use on products where multilayer mother boards relax the routing demands. In such designs, an example of which would be a 60 mil pitch with 30 mil diameter pads, the opportunity to overprint is rather restricted, especially when compared to the 100 mil pitch and 35 mil pad configuration described above. However, experiments on such fine pitch arrays using equivalently proportioned stencils with smaller openings and the same flux system have also demonstrated 30 mil bump heights. This was accomplished, despite the necessarily smaller overpinting, by increasing the effective "metal loading" (or proportion of the solder powder) in the paste. However, if this were done by simply adding more powder to the existing paste/flux combination, the resulting loss of printability would render the effort hopeless before any significant improvement in bump volume could be achieved. In order to avoid this problem, the metal loading was increased through the use of solder alloy powders of significantly different size (or mesh) such that one powder effectively fits into the interstices of the other, thereby directly increasing the metal content of the YD solder paste and assuring more solder alloy in a given volume of deposited paste without significantly compromising printability. Of course, this "multi-powder" approach requires the proper pairing of powder sizes (or "cuts") but it is very effective for improving printed solder bump volumes. Such a "multi-powder" YD paste could as readily be prepared for the bumping the 100 mil pitch grid arrays if even greater bump volumes were desired. Another approach for providing sufficient bump volume without excessive overprinting in the fine pitch designs, includes a "double-printing" of the solder paste. This involves a first bump formation with only moderate overprinting, e.g., 1.5-3 times the pad area, reflow formation of the bumps and printing the solder paste over the bumps followed by another reflow of the solder in the bumps and in the solder paste deposits on the bumps. In this manner a solder joint may be produced which has a height in excess of that obtainable with the single printing, and without danger of shorts between the line-pitched pads.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A process of soldering at least one component to a substrate, said process comprising forming a plurality of solder bumps on pads of said at least one component, placing the component with solder bumps adjacent pads on the substrate, heating the bumps to a temperature sufficient to reflow said bumps, and allowing the bumps to resolidify joining the component to the substrate, said bumps are formed by stencil printing solder paste deposits on said pads of the component, heating the solder paste deposits to the reflow temperature of the solder in the solder paste, and allowing the solder to solidify forming the bumps on the pads of the component, wherein said stencil printing is conducted through apertures in an ultra-thick stencil, the apertures have trapezoidal crossection in the plane normal to the broad surfaces of the stencil, with the top opening of the aperture being smaller than the bottom opening and with the walls of the aperture sloping at an angle within a range of from 1 to 45 degrees from the vertical, said solder paste has a low tackiness and high metal loading characteristics, and said solder paste deposit covers an area which is equal to or exceeds an area of the metal pad in a ratio of from 1.5:1 to 5:1.

2. The process of claim 1, in which the stencil is 12–30 mils thick.

3. The process of claim 1, in which the area covered by the solder paste deposit is at least 3.5 times as large as the area of the pad.

4. The process of claim 1, in which the walls of the apertures slope 5–10 degrees from the broad surface of the stencil.

5. The process of claim 1, in which an effective diameter of the base of the trapezoid is greater than the height of the trapezoid in a ratio ranging from 1.5 to 5.

6. The process of claim 1, in which the solder powder is selected from the group consisting of Sn/Pb, Sn/Ag, Sn/Sb, Sn/Zn, Sn/Bi and Sn/Pb/Bi solder alloys and their combinations.

7. The process of claim 1, in which said solder powder is a Sn/Pb/Bi (43/43/14) solder powder.

8. The process of claim 1, in which said solder paste comprises solder particles and a flux vehicle, said flux vehicle comprises 1 to 10 wt. % of an organic acid, 1 to 5 wt. % of theological additive comprising a polymer having molecular weight greater than 50,000, 60 to 98 wt. % of solvent system, and 0 to 25 wt. % of further additives whose residue maintains high surface insulation.

9. The process of claim 8, in which said flux vehicle comprises 1–8 weight percent 4-hydroxybenzoic acid, 1–3 wt. % ethyl cellulose, 15–30 wt. % propyl-4-hydroxybenzoate, 0–25 wt. % of hydrogenized rosin gum, and the remainder being tripropylene glycol.

10. The process of claim 9, in which said flux vehicle comprises 6.0 wt. % 4-hydroxybenzoic acid, 1.5 wt. % ethyl cellulose, 25 wt. % propyl-4-hydroxybenzoate, 14 wt. % of hydrogenized rosin gum, and 53.5 tripropylene glycol.

11. The process of forming solder bumps on metal pads of an element, which comprises stencil printing solder paste deposits on the pads of the element, applying heat to melt the solder, and allowing the molten solder to solidify forming truncated spherical solder bumps of said pads, wherein said stencil printing is conducted through apertures in an ultra thick stencil, said apertures have trapezoidal crossection in the plane normal to the broad surfaces of the stencil, with the top opening of the aperture being smaller than the bottom opening and with the walls of the aperture sloping at an angle within a range of from 1 to 45 degrees from the vertical, said solder paste has a low tackiness and high metal loading characteristics, and said solder paste deposit covers an area which is equal to or exceeds an area of the metal pad in a ratio of from 1.5:1 to 5:1.

12. The process of claim 11, in which the stencil is 12–30 mils thick.

13. The process of claim 11, in which the area covered by the solder paste deposit is at least 3.5 times as large as the area of the pad.

14. The process of claim 11, in which the walls of the apertures slope 5 to 10 degrees from the broad surface of the stencil.

15. The process of claim 11, in which an effective diameter of the base of the trapezoid is greater than the height of the trapezoid in a ratio ranging from 1.5 to 5.

16. The process of claim 11, in which the solder powder is selected from the group consisting of Sn/Pb, Sn/Ag, Sn/Sb, Sn/Zn, Sn/Bi and Sn/Pb/Bi solder alloys and their combinations.

17. The process of claim 11, in which said solder powder is a Sn/Pb/Bi (43/43/14) solder powder.

18. The process of claim 11, in which said solder paste comprises solder particles and a flux vehicle, said flux vehicle comprises 1 to 10 wt. % of an organic acid, 1 to 5 wt. % of rheological additive comprising a polymer having molecular weight greater than 50,000, 60 to 98 wt. % of solvent system, and 0 to 25 wt. % of further additives whose residue maintains high surface insulation.

19. The process of claim 18, in which said vehicle comprises 1–8 wt. % 4-hydroxybenzoic acid, 1–3 wt. % ethyl cellulose, 15–30 wt. % propyl-4-hydroxybenzoate, 0–25 wt. % of hydrogenized rosin gum, and the remainder being tripropylene glycol.

20. The process of claim 19, in which said vehicle comprises 6 weight percent 4hydroxybenzoic acid, 1.5 wt. % ethyl cellulose, 25 wt. % propyl-4-hydroxybenzoate, 14 wt. % of hydrogenized rosin gum, and 53.5 wt. % tripropylene glycol.

* * * * *